United States Patent
Tsuji et al.

(10) Patent No.: US 7,098,129 B2
(45) Date of Patent: Aug. 29, 2006

(54) INTERLAYER INSULATION FILM USED FOR MULTILAYER INTERCONNECT OF SEMICONDUCTOR INTEGRATED CIRCUIT AND METHOD OF MANUFACTURING THE SAME

(75) Inventors: Naoto Tsuji, Tama (JP); Fumitoshi Ozaki, Tama (JP); Satoshi Takahashi, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 10/657,416

(22) Filed: Sep. 8, 2003

(65) Prior Publication Data

US 2004/0048490 A1    Mar. 11, 2004

(30) Foreign Application Priority Data

Sep. 9, 2002    (JP)    ............... 2002-262304

(51) Int. Cl.
H01L 21/4763    (2006.01)
(52) U.S. Cl. .................. 438/634; 438/633; 438/778
(58) Field of Classification Search ........... 438/699, 438/702, 703, 622–626, 631–633, 437–640, 438/690–697, 778, 780, 787–794
See application file for complete search history.

(56) References Cited

U.S. PATENT DOCUMENTS

| | | | |
|---|---|---|---|
| 6,165,898 A * | 12/2000 | Jang et al. | 438/638 |
| 6,374,770 B1 | 4/2002 | Lee et al. | |
| 6,383,917 B1 | 5/2002 | Cox | |
| 6,593,247 B1 * | 7/2003 | Huang et al. | 438/758 |
| 6,599,847 B1 * | 7/2003 | Jang et al. | 438/787 |
| 6,602,779 B1 * | 8/2003 | Li et al. | 438/622 |
| 6,713,382 B1 * | 3/2004 | Pangrle et al. | 438/622 |
| 6,762,127 B1 * | 7/2004 | Boiteux et al. | 438/702 |
| 6,764,939 B1 * | 7/2004 | Yoshitaka | 438/624 |
| 2002/0106891 A1 * | 8/2002 | Kim et al. | 438/624 |
| 2003/0042605 A1 | 3/2003 | Andideh et al. | |
| 2003/0235980 A1 * | 12/2003 | Huang et al. | 438/638 |

FOREIGN PATENT DOCUMENTS

| | | |
|---|---|---|
| EP | 1 122 770 A2 | 8/2001 |
| EP | 1 148 539 A2 | 10/2001 |
| EP | 1 201 795 A1 | 5/2002 |
| WO | WO 99/55526 A | 11/1999 |
| WO | WO 01/94448 A2 | 12/2001 |

OTHER PUBLICATIONS

Hean Ju Lee, et al., "The mechanical properties of the SiOC(-H) composite thin films with a low dielectric constant" Surface & Coating Technology, Joint International Plasma Sysmposium of the 6th Asia-Pacific Conference on Plasma Science & Techology, Jeju Island, South Korea, vol. 171 No. 1-3, Jul. 1, 2002-Jul. 4, 2002, Elsevier, Switzerland, pp. 296, 300.
U.S. Appl. No. 10/351,669, filed Jan. 24, 2003, Tsuji et al.

* cited by examiner

*Primary Examiner*—Thanhha Pham
(74) *Attorney, Agent, or Firm*—Knobbe, Martens, Olson & Bear LLP

(57) ABSTRACT

An interlayer insulation film for multilayer interconnect of a semiconductor integrated circuit is formed by forming a first insulation film on a substrate by plasma CVD using a silicon-containing hydrocarbon gas; and continuously forming a second insulation film on the first insulation film at a thickness less than the first insulation film in situ by plasma CVD using a silicon-containing hydrocarbon gas and an oxidizing gas. The second insulation film has a hardness of 6 GPa or higher and is used as a polishing stop layer.

13 Claims, 1 Drawing Sheet

INTERLAYER INSULATION FILM USED FOR MULTILAYER INTERCONNECT OF SEMICONDUCTOR INTEGRATED CIRCUIT AND METHOD OF MANUFACTURING THE SAME

BACKGROUND OF THE INVENTION

1. Field of the Invention

The present invention relates to an interlayer insulation film used for multilayer interconnect of a semiconductor integrated circuit and a method of manufacturing the same. More particularly, the present invention relates to a polishing stopper film used for Cu multilayer interconnects and a method of manufacturing the same.

2. Description of the Related Art

Aiming at faster semiconductor integrated circuits with more sophisticated features, miniaturization of the integrated circuits has been advanced. In the past, Al had been used as a material for multilayer interconnects of semiconductor integrated circuits. As wiring has become microscopic and long-distance, however, disconnection troubles which are caused by electromigration arising from increased current density, and signal delays which are caused by electrical resistivity of Al and a dielectric constant of an insulation film, have become issues.

It is Cu that has been brought to attention as a next-generation material for multilayer interconnects. Cu is tolerant to disconnection troubles and its electrical resistivity is smaller than Al. In 1997, a technology called Dual-Damascene was developed by IBM and Motorola. In the past, after wiring was formed by etching an Al film convexly, an interlayer was filled with an insulation film. As against it, in the Dual-Damascene interconnect technology, after a flat interlayer insulation film is trench-etched according to an interconnect pattern and a Cu thin film is electroplated/deposited on the entire surface, the electroplated/deposited Cu is polished by the Chemical Mechanical Polishing (CMP) so that interconnects are formed with the Cu remaining only in a trench portion (for example, "Next-generation ULSI Process Technology", Realize Co./Tokyo, Feb. 29, 2000, pp.558–565).

In this Damascene interconnect technology, application of a low dielectric constant insulation film is essential. As low-k insulation films, an inorganic SOG film deposited by a spin coat process, an a-C:F film deposited by a plasma CVD method using CxFyHz as a source gas, or a SixCyOz film deposited by a plasma CVD method using silicon-containing hydrocarbon as a source gas, etc. are known.

SUMMARY OF THE INVENTION

In the CMP process of the Damascene interconnect technology, the surface of a wafer is polished using polishing pads and polishing fluid (slurry mixes). If a mechanical strength of an insulation film is low, a problem called "dishing" which an insulation film area is caved in more than the Cu interconnect portion occurs. When materials having different polishing rates are polished on the same polished surface, dishing occurs as a material having a high polishing rate is polished unnecessarily because a polishing pad is deformable. A SixCyOz film which is the most promising low-k film in the Damascene interconnect technology has low mechanical strength because it contains many —CHx bonds and is porous; hence, a dishing problem occurs.

If an after-treatment device is provided to solve the dishing problem, not only a device space and costs are increased but also particle contamination which is caused when wafers are transferred between the devices becomes a problem.

Consequently, an object of the present invention is to provide a method of manufacturing an interlayer insulation film with which dishing is effectively prevented during the CMP of the Damascene interconnect technology.

Another object of the present invention is to provide a method of manufacturing an interlayer insulation film at low costs, which does not require a separate device for forming a polishing stopper layer.

In an embodiment, the present invention provides a method for forming an interlayer insulation film for multilayer interconnect of a semiconductor integrated circuit, comprising the steps of: (i) forming a first insulation film on a substrate by plasma CVD using a first source gas comprising a silicon-containing hydrocarbon gas; (ii) continuously forming a second insulation film on the first insulation film at a thickness less than the first insulation film in situ by plasma CVD using a second source gas comprising a silicon-containing hydrocarbon gas and an oxidizing gas; and (iii) subjecting the second insulation film to polishing for forming a subsequent layer thereon. In the above, in an embodiment, the first insulation film may have a hardness of less than 6 GPa (including 1 GPa, 2 GPa, 3 GPa, 4 GPa, 5 GPa, and ranges including any of the forgoing, preferably 1.5–2.5 GPa), and the second insulation film may have a hardness of no less than 6 GPa (including 6.5 GPa, 7 GPa, 8 GPa, 9 GPa, 10 GPa, and ranges including any of the forgoing, preferably 6.0–7.0 GPa). The above hardness of the second insulation film can be achieved without any further curing treatment. However, any suitable curing treatment can be conducted to increase the mechanical strength, such as heating, electronic beam, plasma annealing, etc.

In another embodiment, the first source gas further comprises an oxidizing gas having a flow rate which is less than 1.0 times (preferably no more than 0.5 times) that of the silicon-containing hydrocarbon gas. The first insulation film can be formed without an oxidizing gas, and the silicon-containing hydrocarbon need not contain oxygen. If the silicon-containing hydrocarbon containing no oxygen is used, the first insulation film may be a silicon carbide film. However, the first insulation film is preferably a siloxan polymer or oligomer film having a high porosity, because such films have a low dielectric constant.

In another embodiment, the oxidizing gas in the second source gas has a flow rate which is more than 1.0 times that of the silicon-containing hydrocarbon gas. The second insulation film contains more oxygen or more Si—O bonds than the first insulation film. Preferably, the ratio of Si:O is approximately 1:2. The second insulation film is formed by using more oxygen in a source gas and results in a less porous structure.

In order to form a less porous structure, the deposition rate may be reduced. For example, the second insulation film may be formed under conditions where RF power is reduced and the flow rate of the silicon-containing hydrocarbon is reduced, as compared with those for the first insulation film. The flow rate of the silicon-containing hydrocarbon may be 50–300 sccm (including 75 sccm, 100 sccm, 150 sccm, 200 sccm, 250 sccm, and ranges including any of the foregoing). The oxidizing gas may be used 1–300 times (including 5, 10, 20, 30, 50, 80, 100, 150, 200 times, and ranges including any of the forgoing) that of the silicon-containing hydrocarbon gas in an embodiment. In an embodiment, the oxidizing gas is at least one selected from the group consisting of oxygen, dinitrogenoxide, ozone, hydrogen peroxide, carbon dioxide, and polyalcohol.

In another embodiment, the silicon-containing hydrocarbon in the second source gas has the formula $Si_\alpha O_{\alpha-1} R_{2\alpha-\beta+2}(OC_nH_{2n+1})_\beta$ where $\alpha$ is an integer of 1–3, $\beta$ is an integer of 0–2, n is an integer of 1–3, and R is $C_{1-6}$ hydrocarbon attached to Si. The silicon-containing hydrocarbon is not limited thereto and cyclic siloxan compounds may be used. A preferable silicon-containing hydrocarbon may be dimethy-dimethoxysilane. If the silicon-containing hydrocarbon gas in the first source gas and the silicon-containing hydrocarbon gas in the second source gas are the same gas, no additional piping is required to introduce a different silicon-containing hydrocarbon in the second source gas, thereby conducting in situ the processes efficiently.

In an embodiment, the second insulation film may be composed of multiple layers (e.g., 2, 3, or 4 layers) having different oxygen contents. The multiple layers can be discrete layers or layers having a gradient of oxygen content or Si—O bonds, where the greater the distance from the first insulation film, the higher the oxygen content or Si—O bonds are present in the second insulation film, for example.

In an embodiment, the method may further comprise forming via holes and/or trenches in the first and second insulation films, and filling the holes and/or trenches with copper for interconnect, wherein the polishing conducted thereafter is chemical mechanical polishing (CMP). In this embodiment, the second insulation film is effectively used as a polishing stop layer.

In another aspect, the present invention provides a method for forming an interlayer insulation film for multilayer interconnect of a semiconductor integrated circuit, comprising the steps of: (i) forming a first insulation film having a hardness of less than 6 GPa and a dielectric constant of less than 3.3 on a wiring layer of a substrate by plasma CVD using a first source gas comprising a silicon-containing hydrocarbon gas without an oxidizing gas; and (ii) continuously forming a second insulation film having a hardness of no less than 6 GPa and a dielectric constant of no less than 3.3 on the first insulation film at a thickness less than the first insulation film in situ by plasma CVD using a second source gas comprising said silicon-containing hydrocarbon gas and an oxidizing gas which is included more than the silicon-containing hydrocarbon gas. In an embodiment, the method may further comprise forming via holes and/or trenches in the first and second insulation films, filling the holes and/or trenches with copper for interconnect, and subjecting the second insulation film to chemical mechanical polishing (CMP).

In still another aspect, the present invention provides an insulation film for multilayer interconnect formed in a semiconductor integrated circuit, comprising: (a) a first insulation film formed by plasma CVD using silicon-containing hydrocarbon as a source gas, said first insulation film having a hardness of less than 6 GPa (including 1 GPa, 2 GPa, 3 GPa, 4 GPa, 5 GPa, and ranges including any of the forgoing, preferably 1.5–2.5 GPa) and a dielectric constant of less than 3.3 (including 2.0, 2.5, 3.0, and ranges including any of the forgoing, preferably 1.5–2.5); and (b) a second insulation film formed on the first insulation film by plasma CVD using silicon-containing hydrocarbon gas and oxidizing gas as a source gas, said second insulation film having a hardness of no less than 6 GPa (including 6.5 GPa, 7 GPa, 8 GPa, 9 GPa, 10 GPa, and ranges including any of the forgoing, preferably 6.0–7.0 GPa) and a dielectric constant of no less than 3.3 (including 3.5, 4.0, 4.5, and ranges including any of the forgoing, preferably 3.6–3.9).

In the above, in an embodiment, the first insulation film may have a thickness of 0.1–10 μm (including 0.2 μm, 0.3 μm, 0.5 μm, 1.0 μm, 1.5 μm, 2.0 μm, 5.0 μm, and ranges including any of the forgoing, preferably 0.3–2.0 μm), and the second insulation film may have a thickness of 0.01–1.0 μm (including 0.02 μm, 0.03 μm, 0.05 μm, 0.1 μm, 0.15 μm, 0.2 μm, 0.5 μm, and ranges including any of the forgoing, preferably 0.03–0.15 μm), provided that the thickness of the second insulation film is lower than that of the first insulation film. The second insulation film may effectively be used as a polishing stop layer, and the above thickness is sufficient for that purpose.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Figure 1:
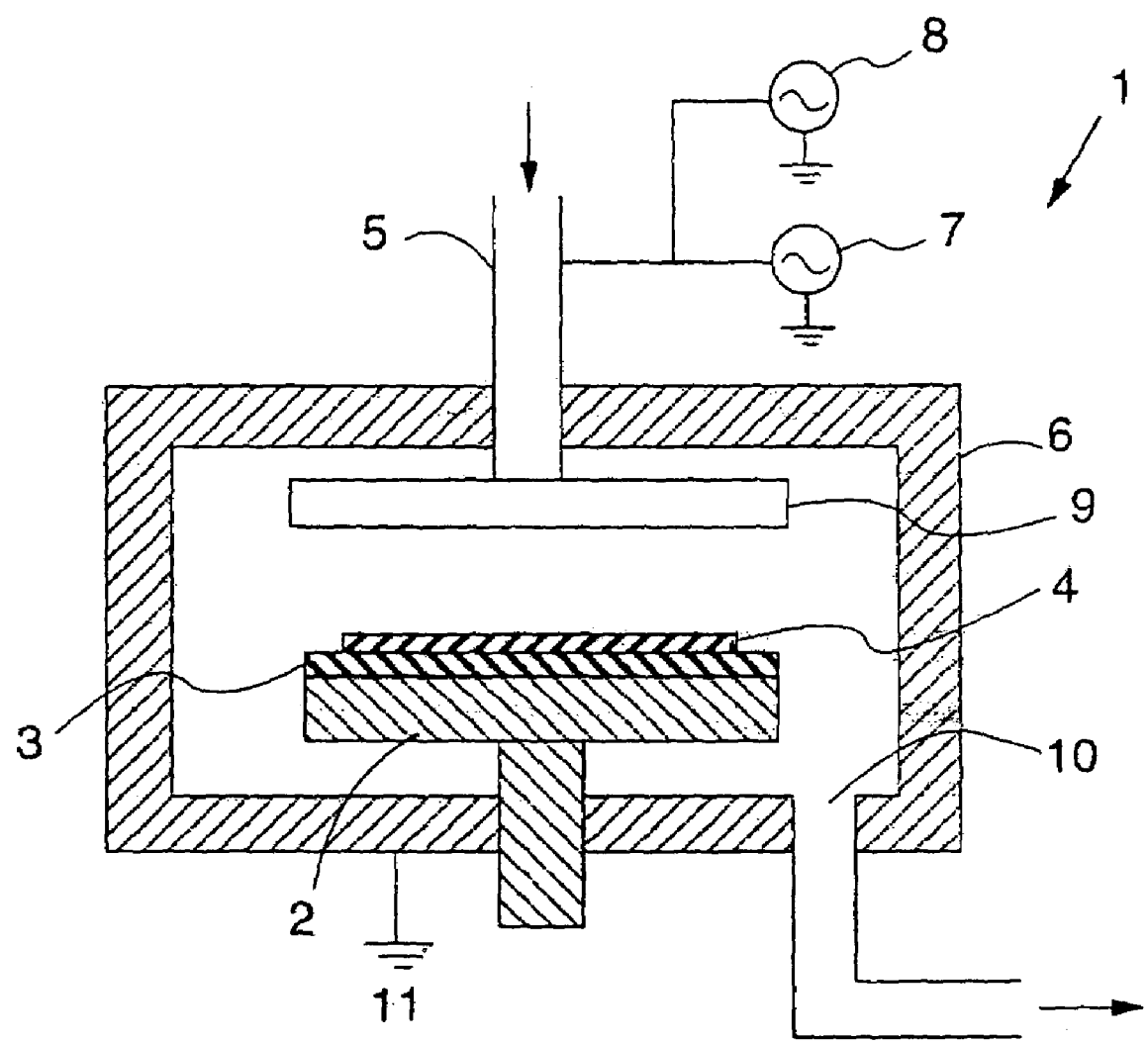
FIG. 1 is a schematic view of a plasma CVD apparatus usable for a method of manufacturing an interlayer insulation film used for multilayer interconnect of a semiconductor integrated circuit according to an embodiment of the present invention.

Explanation of symbols used is as follows: 1: Plasma CVD equipment; 2: Heater; 3: Susceptor; 4: Semiconductor wafer; 5: Source gas inlet port; 6: Reaction chamber; 7: First high-frequency power source; 8: Second high-frequency power source; 9: Shower head; 10: Exhaust port; 11: Ground; 12.

DETAILED DESCRIPTION OF THE PREFERRED EMBODIMENT

The present invention will be described in detail below with reference to preferred embodiments. However, the present invention simply includes these embodiments and should not be limited thereto.

In an embodiment, the method of manufacturing an interlayer insulation film used for multilayer interconnect of a semiconductor integrated circuit comprises the following steps: a step of forming a first insulation film by a plasma CVD method using silicon-containing hydrocarbon as a source gas; and a step of forming a second insulation film on the first insulation film in situ by a plasma CVD method using silicon-containing hydrocarbon gas and oxidizing gas as a source gas, consecutively after the first insulation film has been formed. Preferably, a flow rate of the oxidizing gas may be 1.2 to 100 times that of the silicon-containing hydrocarbon gas.

In the present invention, any suitable one or more silicon-containing hydrocarbon compounds can be used for the first insulation film and/or the second insulation film independently. Linear silicon-containing hydrocarbon compounds and/or cyclic silicon-containing hydrocarbon compounds can be used. The usable compound may include, but is not limited to, a compound or compounds selected from the group consisting of linear compounds having the formula $Si_\alpha O_{\alpha-1} R_{2\alpha-\beta+2}(OR)_\beta$ wherein a is an integer of 1–3, β is 0, 1, or 2, R is $C_{1-6}$ saturated hydrocarbon; cyclic compounds having the formula $Si_n O_n R_{2n}$, wherein n is an integer of 3–6, R is $C_{1-6}$ saturated hydrocarbon; and cyclic compounds having the formula $Si_p(C_2H_2)_p R_{2p}$, wherein p is an integer of 3–6, and R is $C_{1-6}$ saturated or unsaturated hydrocarbon.

The linear compounds include, but are not limited to, the following compounds:

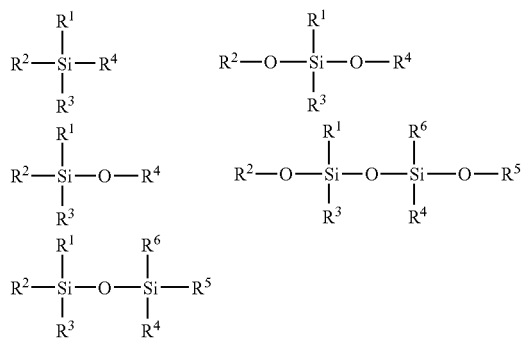

wherein R1, R2, R3, R4, R5, and R6 are each independently $C_{1-6}$ saturated or unsaturated hydrocarbon such as $CH_3$, $C_2H_3$, $C_2H_5$, $C_3H_7$, $C_6H_5$, $C_2H_3$, $C_3H_5$, $C_4H_7$, and $C_4H_5$.

A preferable linear silicon-containing hydrocarbon compound has formula:

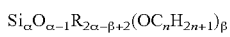

wherein α is an integer of 1–3, β is 0, 1, or 2, n is an integer of 1–3, and R is $C_{1-6}$ hydrocarbon attached to Si. In an embodiment, α is 1 or 2, and β is 2.

These types of source gas is disclosed in U.S. Pat. No. 6,352,945, U.S. Pat. No. 6,383,955, and U.S. Pat. No. 6,432,846, all of which are incorporated herein by reference in their entirety. In embodiments, the source gas may be dimethyl-dimethoxysilane (DM-DMOS), 1,3-dimethoxytetramethyldisiloxan (DMOTMDS) or phenylmethyl dimethoxysilane (PM-DMOS).

Cyclic compounds include, but are not limited to, the following compounds:

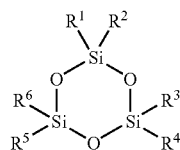

wherein R1, R2, R3, R4, R5, and R6 are each independently $C_{1-6}$ saturated or unsaturated hydrocarbon such as $CH_3$, $C_2H_3$, $C_2H_5$, $C_3H_7$, $C_6H_5$, $C_3H_5$, $C_3H_5$, $C_4H_7$, and $C_4H_5$.

Cyclic compounds having the formula $Si_p(C_2H_2)_p R_{2p}$, wherein p is an integer of 3–6, and R is $C_{1-6}$ saturated or unsaturated hydrocarbon, include, but are not limited to, the following compound:

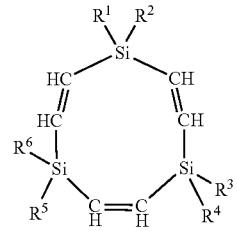

wherein R1, R2, R3, R4, R5, and R6, are each independently $C_{1-6}$ saturated or unsaturated hydrocarbon such as $CH_3$, $C_2H_3$, $C_2H_5$, $C_3H_7$, $C_6H_5$, $C_3H_5$, $C_4H_7$, and $C_4H_5$.

Different source gases can be mixed or a single source gas can be used alone.

The first insulation film can be formed by any suitable plasma CVD method. In an embodiment, an additive gas may be used which is selected from the group consisting of a carrier gas, an oxidizing gas, and a plasma stabilizing gas. For the first insulation film, an oxidizing gas may be supplied at a flow rate of 0–100% (including 10%, 20%, 30%, 40%, 50%, 80%, and ranges including any of the forgoing, preferably less than 50%) of that of a silicon-containing hydrocarbon compound. The oxygen-supplying gas can be any suitable gas which can supply oxygen and may include $O_2$, NO, $O_3$, $H_2O_2$, $CO_2$, and $N_2O$ so that oxygen is supplied to adjust a Si/O ratio (e.g., 1:1.3–1:1.7) in the reaction gas or to improve reaction efficacy. For example, when the compound includes less than two alkoxy groups, an oxidizing gas may be added to supply oxygen to form a siloxan polymer.

The carrier gas can be any suitable inert gas including Ar, Ne, He, and $N_2$. The inert gas may be supplied at a flow rate of 15–300% (50% or more in an embodiment) of that of the source gas. Further, in an embodiment, a plasma stabilizing (cross-linking) gas such as CxHyOz wherein x=0–5, y=2–12, and z=0–3 (such as $C_nH_{2n+2}$ (n=1–5), $C_nH_{2n+1}OH$ (n=1–5) such as 1,2-propanediol, isopropyl alcohol) can be used so that hardness of the first insulation film can be improved.

The flow rate of additive gas may be 0% to about 500% of the source gas flow (including 10%, 50%, 100%, 200%, 300%, 400%, and ranges including any of the foregoing).

In an embodiment, the reaction gas is excited upstream of the reaction chamber. In this embodiment, the reaction gas can be excited in a remote plasma chamber installed upstream of a reactor, and the film is deposited on a substrate in the reactor. The source gas and the additive gas can be introduced into the remote plasma chamber. In this case, a reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent applications Ser. No. 09/511,934 filed Feb. 24, 2000 and Ser. No. 09/764,523 filed Jan. 18, 2001, U.S. Pat. No. 5,788,778, and U.S. Pat. No. 5,788,799. The disclosure of each of the above is incorporated herein by reference in its entirety.

Further, the excitation of the reaction gas may comprise exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber. Alternatively, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heater chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

Further, the excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction gas flows into the reactor for deposition of a film. In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber.

The flow rate of the reaction gas is determined based on the intensity of RF power, the pressure selected for reaction, and the type of source gas and cross-linking gas. The reaction pressure is normally in the range of 1–10 Torr, preferably 3–7 Torr, so as to maintain a stable plasma. This reaction pressure is relatively high in order to lengthen the residence time of the reaction gas. The total flow of the reaction gas is important for reducing the relative dielectric constant of a resulting film. In general, the longer the residence time, the lower the relative dielectric constant becomes. The source gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the source gas (preferably 100–500 sccm, including 150, 200, 250 sccm) is expected to be included in the reaction gas. A temperature of the semiconductor wafer may be maintained at a temperature of e.g., 350 to 450° C.

In an embodiment, radio-frequency (RF) power is high-frequency power without low-frequency power. In an embodiment, to effectively reduce film stress, high-frequency RF power and low-frequency RF power can be overlaid. That is, a combination of high-frequency power has 2 MHz or higher frequencies (including 5, 10, 15, 20, 25, 30, 40, 50, 60, 70 MHz, and ranges including any of the forgoing) and low-frequency RF power having less than 2 MHz frequencies can be used (the ratio of low-frequency power to high-frequency power may be less than 50% including 40%, 30%, 20%, 10%, 5%, 0%, and ranges including any of the forgoing (preferably, 1%–10%). High-frequency RF power may be applied at a high power level such as 1.5 W/Cm$^2$ or higher (including 2.0, 2.25, 2.5, 2.75, 3.0, 3.25, 3.5 W/cm$^2$, and ranges including any of the foregoing). Such a high power level can increase the mechanical strength and deposition rate of a resultant insulation film.

In order to form siloxan polymers or oligomers as the first insulation film in the present invention, the residence time of a reaction gas may be controlled as disclosed in U.S. Pat. No. 6,352,945, U.S. Pat. No. 6,383,955, and U.S. Pat. No. 6,432,846, all of which are incorporated herein by reference in their entirety. However, in the present invention, the residence time can very more widely than the above. In embodiments, Rt may be 50 msec or higher (including 70 msec, 90 msec, 100 msec, 150 msec, 200 msec, 250 msec, and ranges including any of the forgoing).

The first insulation film may have a dielectric constant of 2.0–3.5, preferably 2.5–3.1, and a hardness of 1.0–6.0 GPa, preferably 1.5–2.5 GPa. The film thickness can vary depending on the semiconductor design, and in an embodiment, may be in the range of 0.1–5.0 μm, preferably 0.3–2.0 μm.

The second insulation film can be formed continuously in the reaction chamber. The silicon-containing hydrocarbon compound used for the first insulation film can be changed to or can be used in addition to one or more different silicon-containing hydrocarbon compounds for the second insulation film. The flow rate of a silicon-containing hydrocarbon compound for the second insulation film may be lower than that used for the first insulation film. For example, the flow rate for the second formation may be less than 100%, 80%, 60%, 40%, or 20% of the flow rate for the first formation. In an embodiment, the flow rate of a silicon-containing hydrocarbon compound for the second formation is 10–1,000 sccm, preferably 50–300 sccm.

The deposition method, the reaction chamber, and the deposition conditions used for the first film formation may be, but need not be, employed for the second film formation except for those described below, and the second film can be, but need not be, formed continuously in the same reaction chamber.

For the formation of the second insulation film, an oxidizing gas is indispensable to improve the mechanical strength. The oxidizing gas here is used as a part of the source gas, not as a part of an additive gas. The oxidizing gas can be the same as or different from those used in the formation of the first insulation film. However, because the oxidizing gas is used as a part of the source gas, i.e., an element constituting a second insulation film itself, the oxidizing gas may be at least one selected from the group consisting of comprises oxygen, dinitrogenoxide, ozone, hydrogen peroxide, carbon dioxide, and alcohol such as ethylene glycol, 1,2 propanediol, and isopropyl alcohol (IPA), which contributes to formation of Si—O bonds with a silicon-containing hydrocarbon compound in a metric.

In an embodiment, the flow rate of an oxidizing gas may be more than that of the silicon-containing hydrocarbon compound. For example, the ratio of the flow rate of the oxidizing gas to that of the silicon-containing hydrocarbon compound may be 1.0 to 300, preferably 1.2 to 100 (including 1.5, 2, 5, 10, 20, 30, 50, 80, and ranges including any of the forgoing). A high flow rate of an oxidizing gas may contribute to a film structure having less Si—C bonds and less C—H bonds, thereby forming a more dense and stable structure. It is expected that the structure is less porous because more Si—O bonds are formed more densely. In an embodiment, a silicon oxide polymer or oligomer is formed.

An inert gas and other gases (such as a plasma stabilizing gas) can be added in the range of 0–100% (including 10%, 30%, 50%, 80%, and ranges including any of the forgoing) of the silicon-containing hydrocarbon compound.

RF power or frequency can be the same as or different from those used in the first formation. In general, high power renders mechanical strength of a film high. However, when a high flow rate of an oxidizing gas is used, a plasma may become unstablilized. In that case, RF power is reduced. For example, high-frequency RF power may be applied at a high power level such as 0.1 W/cm$^2$ or higher but 3.0 W/cm$^2$ or lower (including 0.2, 0.5, 1.0, 1.5, 2.0, 2.5 W/cm$^2$, and ranges including any of the foregoing). The RF power for the second film formation may be lower than 100%, 80%, 50%, or 30% of that for the first film formation. As with the first film formation, a combination of high-frequency RF power and low-frequency RF power can be used. Although higher RF power is generally preferable, suitable RF power can vary depending the flow rate of an oxidizing gas and the flow rate of an silicon-containing hydrocarbon compound, etc.

The reaction pressure for the second film formation is normally in the range of 0.1–10 Torr, preferably 0.5–5 Torr (including 0.75, 1, 2, 3, and ranges including any of the forgoing), so as to maintain a stable plasma even though the flow rate of an oxidizing gas is high. The reaction pressure for the second film formation may be lower than that for the first film formation. When the reaction pressure is too low or too high, the uniformity of film thickness may suffer.

The second insulation film has a dielectric constant of 3.0–5.0, preferably 3.5–3.9, and a hardness of 6 GPa or higher, preferably 6–15 GPa. The film thickness can vary depending on the semiconductor design, and in an embodiment, may be in the range of 0.01–0.5 μm, preferably 0.03–0.15 μm.

In another embodiment of the present invention, the second insulation film may not be uniform in a vertical direction. That is, in an embodiment, the second insulation film may have a gradient hardness in the vertical direction. The outmost surface of the second insulation film may be hardest and the boundary surface with the first insulation film may be as hard as the first insulation film. In an embodiment, the flow rate of an oxidizing gas (and/or the reason pressure, the RF power and frequency, the flow rate of an silicon-containing hydrocarbon compound, etc.) may gradually increase at a certain rate, so that the oxygen concentration increases and the carbon concentration decreases toward the outmost surface of the second insulation film. In an embodiment, the closer the distance to the outmost surface of the second insulation film, the higher the mechanical strength becomes.

In another embodiment, the second insulation film is composed of multiple layers or films each having a different hardness, wherein the closer the distance to the outmost surface of the second insulation film, the higher the mechanical strength becomes.

The present invention is described in detail with referent to the drawing. The drawing shows simply an embodiment, and the present invention is not limited thereto. FIG. 1 is a schematic view of plasma CVD equipment useable for a method of manufacturing an interlayer insulation film used for multilayer interconnect of a semiconductor integrated circuit according to an embodiment of the present invention.

The plasma CVD equipment 1 includes a reaction chamber 6. Inside the reaction chamber 6, a susceptor 3 holding a semiconductor wafer 4 thereon is set up. The susceptor 3 is supported by a heater 2; the heater 2 maintains the semiconductor wafer 4 at a given temperature (e.g., 350 to 450° C.). The susceptor 3 also serves as one electrode for plasma discharge as well and is grounded 11 through the reaction chamber 6. On the ceiling inside the reaction chamber 6, a shower head 9 is set up in parallel and opposing to the susceptor 3. The shower head 9 has many fine pores in its bottom, from which a jet of source gases described later is emitted to the semiconductor wafer 4. In the center of the shower head 9, a source gas inlet port 5 is provided; the source gases are brought into the shower head 9 via a gas line (not shown). The gas inlet port 5 is electrically insulated from the reaction chamber 6. The shower head 9 also serves as the other electrode for plasma discharge and is connected to the first high-frequency power source 7 and the second high-frequency power source 8 via source gas inlet port 5. With this setup, a plasma reaction zone is generated in the vicinity of the semiconductor wafer 4. At the bottom of the reaction chamber 6, an exhaust port 10 is provided and is connected to an external vacuum pump (not shown).

The method of manufacturing an interlayer insulation film used for multilayer interconnect of a semiconductor integrated circuit according to an embodiment of the present invention is described below. The method of manufacturing an interlayer insulation film used for multilayer interconnect according to the present invention includes a step of forming a first insulation film by the plasma CVD method using silicon-containing hydrocarbon as a source gas. The source gas here is silicon-containing hydrocarbon which is expressed by a general formula: $Si_\alpha O_{\alpha-1}(R)_{2\alpha-\beta+2}(OC_nH_{2n+1})_\beta$ (where $\alpha$ is an integer of 1–3; $\beta$ is an integer of 0–2; n is an integer of 1–3, and R is $C_{1-6}$ hydrocarbon attached to Si) and is preferably DM-DMOS (dimethyldimethoxysilane). In addition to it, as a sub-source gas, $CO_2$, alcohol, hydrocarbon which contains at least one unsaturated bond, or $N_2$ can be contained. If a Si/O ratio needs to be controlled, $O_2$ or $N_2O$ can also be added as a sub-source gas. Additionally, as an added gas, inert gases such as Ar and/or He can also be added in.

After the reaction chamber 6 is evacuated by the external vacuum pump (not shown), the source gas is brought into the reaction chamber 6 from the gas inlet port 5 through the shower head 9. Subsequently, high-frequency power for plasma excitation is applied from the first high-frequency power source 7 and the second high-frequency power source 8, and a plasma reaction zone is formed in the vicinity of the semiconductor wafer 4. A frequency of the first high-frequency power source 7 here is above 2 MHz, and a frequency of the second high-frequency power source 8 to be overlapped is below 2 MHz. Selectively it is possible to use only the first high-frequency power source 7. Source gas atoms which are decomposed in the plasma react chemically, and the first insulation film containing SixCyOz is deposited on the semiconductor wafer 4.

Additionally, the method of manufacturing an interlayer insulation film used for multilayer interconnect according to an embodiment of the present invention includes a step of forming a second insulation film on the first insulation film by a plasma CVD method using silicon-containing hydrocarbon and oxidizing gas as a source gas. The plasma CVD method for the second insulation film can be the same as or different from the plasma CVD method for the first insulation film. Further, in another embodiment, the second insulation film can be formed in another reaction chamber.

The silicon-containing hydrocarbon used as a source gas here is silicon-containing hydrocarbon which is expressed by a general formula: $Si_\alpha O_{\alpha-1} R_{2\alpha-\beta+2}(OC_n H_{2n+1})_\beta$ (where $\alpha$ is an integer of 1–3; $\beta$ is an integer of 0–2; n is an integer of 1–3, and R is $C_{1-6}$ hydrocarbon attached to Si) and is preferably DM-DMOS (dimethy-dimethoxysilane). The oxidizing gas used as a source gas comprises at least one of oxygen, dinitrogenoxide, ozone, hydrogen peroxide, carbon dioxide, or alcohol. As described below in detail, after research work was pursued earnestly, it was found that, in an embodiment, by controlling a flow rate of the oxidizing gas to be e.g., 1.2 to 100 times as much as a flow rate of the silicon-containing hydrocarbon, the resulting second insulation film possesses high mechanical strength and serves as a polishing stopper film.

After the first insulation film is formed, source gases are brought into the reaction chamber 6 from the gas inlet port 5 in situ and consecutively. At this time, a flow rate of oxidizing gas may be controlled 1.2 to 100 times as much as a flow rate of the silicon-containing hydrocarbon, for example. Subsequently, high-frequency power for plasma excitation is applied from the first high-frequency power source 7 and the second high-frequency power source 8, and a plasma reaction zone is formed in the vicinity of the semiconductor wafer 4. A frequency of the first high-frequency power source 7 here is above 2 MHz and a frequency of the second high-frequency power source 8 to be overlapped is below 2 MHz. Selectively it is possible to use only the first high-frequency power source 7. Source gas atoms which are decomposed in the plasma react chemically, and the second insulation film containing $SiO_2$ is deposited on the semiconductor wafer 4.

A characteristic of the first insulation film is that it has a low dielectric constant. This is because Si—C bonds in the main source gas (silicon-containing hydrocarbon) are incorporated in the film as they are; hence, the density of the film becomes nondense. The first insulation film has a shortcoming of low mechanical strength because it contains many —CHx bonds in the film and is porous. Focusing attention on this particular aspect, the inventors of the present invention have reached to invent a method of forming the second insulation film having high mechanical strength on the first insulation film to cover the shortcoming of the first insulation film. A characteristic of the second insulation film is that it has high mechanical strength. It is thought that the film becomes dense because C is not incorporated in the film by excessively feeding the oxidizing gas.

EXAMPLES

Experiments to evaluate insulation films formed by the method of manufacturing interlayer insulation films according to the present invention were conducted; the results of the experiments are described below. In the experiments, using DM-DMOS as a main gas, evaluation of the second insulation films alone and CMP tests of a Damascene structure of the first and the second insulation films combined were conducted in respective cases.

The conditions used were as follows:

Plasma CVD system: Eagle™-12 (manufactured by ASM Japan in Tokyo)

| <Deposition condition for the first insulation film> | | |
|---|---|---|
| Main source gas: | DM-DMOS | 200 sccm |
| Added gas: | He | 400 sccm |
| First RF frequency: | 27.12 MHz | 2.8 W/cm$^2$ |
| <Deposition condition for the second insulation film> | | |
| Main source gas: | DM-DMOS | 100 sccm |
| Oxidizing gas: | $O_2$ | |
| First RF frequency: | 27.12 MHz | |

Other deposition conditions for the second insulation film are as shown in Table 1 below.

TABLE 1

| | $O_2$ Flow Rate (sccm) | Flow Rate Ratio | Pressure (Pa) | First RF frequency (W/cm$^2$) |
|---|---|---|---|---|
| 1 | 2,000 | 20 | 250 | 1 |
| 2 | 120 | 1.2 | 250 | 1 |
| 3 | 10,000 | 100 | 250 | 1 |
| 4 | 2,000 | 20 | 100 | 1 |
| 5 | 2,000 | 20 | 400 | 1 |
| 6 | 2,000 | 20 | 250 | 0.5 |
| 7 | 2,000 | 20 | 250 | 1.5 |
| 8 | 0 | 0 | 250 | 1 |
| 9 | 50 | 0.5 | 250 | 1 |

Under these conditions, by depositing the second insulation film of 1 μm, film thickness distribution, a reflective index and hardness of the film were evaluated. Evaluation results are shown in Table 2.

TABLE 2

| | Film Thickness Distribution (± %) | Reflective Index | Hardness (GPa) |
|---|---|---|---|
| 1 | 1.6 | 1.45 | 6.5 |
| 2 | 2.0 | 1.45 | 6.3 |
| 3 | 2.2 | 1.45 | 6.6 |
| 4 | 3.7 | 1.45 | 6.8 |
| 5 | 4.9 | 1.45 | 6.1 |
| 6 | 1.9 | 1.45 | 6.2 |
| 7 | 1.8 | 1.45 | 6.7 |
| 8 | not measured | 1.42 | 2.14 |
| 9 | not measured | 1.43 | 2.06 |

Preferable hardness of a CMP polishing stopper is 6 GPa or higher. From these experimental results, it was understood that preferable deposition conditions for the second insulation film were: a flow rate of an oxidizing gas/the main source gas=1.2 to 100; a pressure of 100 to 400 Pa; the first RF high-frequency power=0.5 to 1.5 W/cm$^2$. As can be seen, the flow rate of oxygen is critical to mechanical strength. That is, in a ratio of approximately one ($O_2$/DMDMOS), the hardness changes drastically. Incidentally, the films of Nos. 8 and 9 had a dielectric constant of 2.90 and 2.88, respectively.

A CMP test conducted is described below. The first insulation film of 1 μm was formed using the above-mentioned system and deposition conditions. After that, the second insulation film of 0.1 μm was formed in situ according to the deposition conditions shown in Table 1 continuously. After the CMP was performed on the Damascene structure fabricated, no dishing was detected under all conditions shown in Table 1.

As shown above, using the method of manufacturing an interlayer insulation film used for multilayer interconnect according to an embodiment of the present invention, in the CMP process of the Damascene interconnect technology, an insulation film functioning as a polishing stopper is able to be provided. As a result, the dishing problem of a SixCyOz film, a low-k insulation film, can effectively be solved.

Additionally, with the method of manufacturing an interlayer insulation film used for multilayer interconnect according to an embodiment of the present invention, because conventional plasma CVD equipment can be used as it is, no additional equipment for after-treatment is required at all; hence the method does not increase device space and costs.

The present invention includes, but is not limited to, the following embodiments:

1) A method of manufacturing an interlayer insulation film used for multilayer interconnect of a semiconductor integrated circuit, which comprises steps of: forming a first insulation film by a plasma CVD method using silicon-containing hydrocarbon as a source gas; forming a second insulation film on said first insulation film in situ by a plasma CVD method using silicon-containing hydrocarbon gas and oxidizing gas as a source gas, consecutively after said first insulation film has been formed.

2) The method as set forth in Item 1, wherein a flow rate of said oxidizing gas is 1.2 to 100 times as much as a flow rate of said silicon-containing hydrocarbon gas.

3) The method as set forth in Item 1, wherein said silicon-containing hydrocarbon is expressed by a general formula: $Si_\alpha O_{\alpha-1} R_{2\alpha-\beta+2}(OC_n H_{2n+1})_\beta$, where $\alpha$ is an integer of 1–3; $\beta$ is an integer of 0–2; n is an integer of 1–3, and R is $C_{1-6}$ hydrocarbon attached to Si.

4) The method as set forth in Item 3, wherein said silicon-containing hydrocarbon is dimethy-dimethoxysilane.

5) The method as set forth in Item 1, wherein said oxidizing gas comprises at least one of oxygen, dinitrogenoxide, ozone, hydrogen peroxide, carbon dioxide or alcohol.

6) An insulation film used for multilayer interconnect of a semiconductor integrated circuit, which comprises a first insulation film formed by a plasma CVD method using silicon-containing hydrocarbon as a source gas and a second insulation film formed on said first insulation film by a plasma CVD method using silicon-containing hydrocarbon gas and oxidizing gas as a source gas.

7) The insulation film used for multilayer interconnect as set forth in Item 6, wherein a flow rate of said oxidizing gas is 1.2 to 100 times as much as a flow rate of said silicon-containing hydrocarbon gas.

8) The insulation film used for multilayer interconnect as set forth in Item 6, wherein said silicon-containing hydrocarbon is expressed by a general formula: $Si_\alpha O_{\alpha-1} R_{2\alpha-\beta+2}(OC_n H_{2n+1})_\beta$, where $\alpha$ is an integer of 1–3; $\beta$ is an integer of 0–2; n is an integer of 1–3, and R is $C_{1-6}$ hydrocarbon attached to Si.

9) The insulation film used for multilayer interconnect as set forth in Item 8, wherein said silicon-containing hydrocarbon is dimethy-dimethoxysilane.

10) The insulation film used for multilayer interconnect as set forth in Item 6, wherein said oxidizing gas comprises at least one of oxygen, dinitrogenoxide, ozone, hydrogen peroxide, carbon dioxide or alcohol.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming an interlayer insulation film for multilayer interconnect of a semiconductor integrated circuit, comprising the steps of:
    forming a first insulation film on a substrate in a reactor by plasma CVD using a first source gas comprising a silicon-containing hydrocarbon gas;
    continuously forming a second insulation film on the first insulation film in the same reactor at a thickness less than the first insulation film in situ by plasma CVD using a second source gas comprising a silicon-containing hydrocarbon gas and an oxidizing gas under a pressure of 3 Torr or less which is lower than a pressure used for the formation of the first insulation film; and
    subjecting the second insulation film to polishing for forming a subsequent layer thereon wherein the first insulation film has a hardness of less than 6 GPa, and the second insulation film has a hardness of no less than 6 GPa.

2. The method according to claim 1, wherein the pressure for forming the second insulating film is 1 Torr or less.

3. A method for forming an interlayer insulation film for multilayer interconnect of a semiconductor integrated circuit, comprising the steps of:
    forming a first insulation film on a substrate by plasma CVD using a first source gas comprising a silicon-containing hydrocarbon gas;
    continuously forming a second insulation film on the first insulation film at a thickness less than the first insulation film in situ by plasma CVD using a second source gas comprising a silicon-containing hydrocarbon gas and an oxidizing gas; and
    subjecting the second insulation film to polishing for forming a subsequent layer thereon,
wherein the first insulation film has a hardness of less than 6 GPa, and the second insulation film has a hardness of no less than 6 GPa.

4. The method according to claim 3,
    wherein the first source gas further comprises an oxidizing gas having a flow rate which is less than 1.0 times that of the silicon-containing hydrocarbon gas.

5. The method as claimed in claim 4, wherein the oxidizing gas in the first source gas is at least one selected from the group consisting of oxygen, dinitrogenoxide, ozone, hydrogen peroxide, carbon dioxide, and polyalcohol.

6. The method as claimed in claim 4, wherein the silicon-containing hydrocarbon gas in the first source gas and the silicon-containing hydrocarbon gas in the second source gas are the same gas.

7. The method according to claim 3,
    wherein the oxidizing gas in the second source gas has a flow rate which is more than 1.0 times that of the silicon-containing hydrocarbon gas in the second source gas.

8. The method as claimed in claim 7, wherein the second insulation film is formed under conditions where RF power is reduced and the flow rate of the silicon-containing hydrocarbon is reduced, as compared with those for the first insulation film.

9. The method according to claim 3, wherein the silicon-containing hydrocarbon in the second source gas has the formula $Si_\alpha O_{\alpha-1} R_{2\alpha-\beta+2}(OC_n H_{2n+1})_\beta$ where $\alpha$ is an integer of 1–3, $\beta$ is an integer of 0–2, n is an integer of 1–3, and R is $C_{1-6}$ hydrocarbon attached to Si.

10. The method as claimed in claim 9, wherein the silicon-containing hydrocarbon in the second source gas is dimethy-dimethoxysilane.

11. The method according to claim 3, wherein the first source gas comprises no oxidizing gas.

12. The method according to claim 3, wherein the second insulation film is composed of multiple layers having different oxygen contents.

13. The method according to claim 3, further comprising forming via holes and/or trenches in the first and second insulation films, and filling the holes and/or trenches with copper for interconnect, wherein said polishing is chemical mechanical polishing (CMP) and is conducted after the filling of the holes and/or trenches with copper.

* * * * *

UNITED STATES PATENT AND TRADEMARK OFFICE
CERTIFICATE OF CORRECTION

PATENT NO.         : 7,098,129 B2
APPLICATION NO. : 10/657416
DATED                   : August 29, 2006
INVENTOR(S)       : Naoto Tsuji, Fumitoshi Ozaki and Satoshi Takahashi It is certified that error appears in the above-identified patent and that said Letters Patent is hereby corrected as shown below:

On Title Page item 56

On the first page, at Column 2 (Other Publications), please delete "Sysmposium" and insert -- Symposium --, therefor.

On the first page, at Column 2 (Other Publications), please delete "Techology," and insert -- Technology, --, therefor.

Column 3, line 11, after "may be," please delete "dimethy-dimethoxysilane" and insert -- dimethyl-dimethoxysilane --, therefor.

Column 10, line 41-42, after "DM-DMOS," please delete "dimethy-dimethoxysilane" and insert -- dimethyl-dimethoxysilane,-- therefor.

Column 11, line 11, after "DM-DMOS," please delete "dimethy-dimethoxysilane" and insert -- dimethyl-dimethoxysilane,-- therefor.

Column 13, line 37-38, after "hydrocarbon is," please delete "dimethy-dimethoxysilane" and insert -- dimethyl-dimethoxysilane,-- therefor.

Column 13, line 63, after "hydrocarbon is," please delete "dimethy-dimethoxysilane" and insert -- dimethyl-dimethoxysilane,-- therefor.

Column 15, line 10, after "the second gas is," please delete "dimethy-dimethoxysilane" and insert -- dimethy-dimethoxysilane,-- therefor.

Column 5, line 9, after "wherein," please delete "a" and insert -- $\alpha$ --, therefor.

Column 5, line 66, after "$C_6H_5$," please delete "$C_3H_5$, $C_3H_5$," and insert -- $C_3H_5$,--, therefor.

UNITED STATES PATENT AND TRADEMARK OFFICE
CERTIFICATE OF CORRECTION

| | |
|---|---|
| PATENT NO. | : 7,098,129 B2 |
| APPLICATION NO. | : 10/657416 |
| DATED | : August 29, 2006 |
| INVENTOR(S) | : Naoto Tsuji, Fumitoshi Ozaki and Satoshi Takahashi |

It is certified that error appears in the above-identified patent and that said Letters Patent is hereby corrected as shown below:

Column 8, line 11, after "such as 1.5," please delete "$W/Cm^2$" and insert -- $W/cm^2$ --, therefor.

Column 9, line 18, after "become," please delete "unstablilized." And insert -- unstabilized.-- therefor.

Signed and Sealed this

Thirteenth Day of February, 2007

JON W. DUDAS
*Director of the United States Patent and Trademark Office*